United States Patent
Gulati et al.

(10) Patent No.: US 10,929,222 B2
(45) Date of Patent: *Feb. 23, 2021

(54) STORING ADDRESS OF SPARE IN FAILED MEMORY LOCATION

(71) Applicant: Apple Inc., Cupertino, CA (US)

(72) Inventors: Manu Gulati, Saratoga, CA (US);
Sukalpa Biswas, Fremont, CA (US);
Jeffrey R. Wilcox, San Jose, CA (US);
Farid Nemati, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 58 days.

This patent is subject to a terminal disclaimer.

(21) Appl. No.: 16/405,362

(22) Filed: May 7, 2019

(65) Prior Publication Data

US 2019/0286519 A1 Sep. 19, 2019

Related U.S. Application Data

(63) Continuation of application No. 16/029,829, filed on Jul. 9, 2018, now Pat. No. 10,318,377, which is a
(Continued)

(51) Int. Cl.
*G06F 11/10* (2006.01)
*G11C 29/52* (2006.01)
(Continued)

(52) U.S. Cl.
CPC .......... *G06F 11/1068* (2013.01); *G11C 29/52* (2013.01); *G06F 12/0669* (2013.01);
(Continued)

(58) Field of Classification Search
CPC ............. G06F 11/1068; G06F 12/1072; G06F 12/121; G06F 12/12; G06F 12/0669;
(Continued)

(56) References Cited

U.S. PATENT DOCUMENTS 10,042,701 B2    8/2018   Gulati
10,318,377 B2    6/2019   Gulati et al.
(Continued)

OTHER PUBLICATIONS

Cai, Yu et al. "Neighbor-cell assisted error correction for MLC NAND flash memories." SIGMETRICS '14 (2014). (Year: 2014).*
(Continued)

*Primary Examiner* — Cynthia Britt
(74) *Attorney, Agent, or Firm* — Kowert, Hood, Munyon, Rankin & Goetzel, P.C.; Lawrence J. Merkel

(57) ABSTRACT

In one embodiment, a system includes a memory that includes a live section and a spares section. The live section may be mapped to the address space of the system, and may be accessed in response to memory operations. Once an entry in the live section has been detected as failed, an entry in the spares section may be allocated to replace the failed entry. During subsequent accesses to the failed entry, the allocated entry may be used instead. In an embodiment, the failed entry may be coded with an indication of the allocated entry, to redirect to the allocated entry. In one implementation, for example, the failed entry may be coded with N copies of a pointer to the allocated entry, each copy protected by corresponding ECC.

20 Claims, 7 Drawing Sheets

Related U.S. Application Data continuation of application No. 15/273,208, filed on Sep. 22, 2016, now Pat. No. 10,042,701.

(60) Provisional application No. 62/234,287, filed on Sep. 29, 2015.

(51) Int. Cl.

| | | |
|---|---|---|
| *G11C 29/00* | (2006.01) | |
| *G06F 12/1072* | (2016.01) | |
| *G06F 12/121* | (2016.01) | |
| *G06F 12/12* | (2016.01) | |
| *G06F 12/06* | (2006.01) | |
| *G06F 12/126* | (2016.01) | |
| *G11C 29/04* | (2006.01) | |
| *G11C 29/44* | (2006.01) | |

(52) U.S. Cl.
CPC .......... *G06F 12/1072* (2013.01); *G06F 12/12* (2013.01); *G06F 12/121* (2013.01); *G06F 12/126* (2013.01); *G06F 2212/1032* (2013.01); *G06F 2212/7204* (2013.01); *G06F 2212/7207* (2013.01); *G11C 29/70* (2013.01); *G11C 29/72* (2013.01); *G11C 2029/0409* (2013.01); *G11C 2029/0411* (2013.01); *G11C 2029/4402* (2013.01)

(58) Field of Classification Search
CPC .......... G06F 12/126; G06F 2212/7204; G06F 2212/7207; G06F 2212/1032; G11C 29/52; G11C 2029/0409; G11C 29/70; G11C 29/72; G11C 2029/0411; G11C 2029/4402

See application file for complete search history.

(56) References Cited

U.S. PATENT DOCUMENTS

| | | | |
|---|---|---|---|
| 2003/0115518 A1 | 6/2003 | Kleveland et al. | |
| 2010/0005376 A1 | 1/2010 | LaBerge et al. | |
| 2011/0066902 A1* | 3/2011 | Sharon ................... | G11C 29/50 714/721 |
| 2013/0159602 A1 | 6/2013 | Adams et al. | |
| 2014/0011300 A1 | 1/2014 | Kim | |
| 2014/0075135 A1* | 3/2014 | Choi ................... | G11C 11/4076 711/155 |
| 2014/0146609 A1 | 5/2014 | Avila et al. | |
| 2014/0146624 A1* | 5/2014 | Son ................... | G11C 29/808 365/200 |
| 2016/0124806 A1 | 5/2016 | Yen | |
| 2016/0225461 A1* | 8/2016 | Tuers ................... | G11C 11/5642 |
| 2016/0307645 A1 | 10/2016 | Kim et al. | |
| 2017/0091026 A1 | 3/2017 | Gulati et al. | |
| 2017/0242624 A1* | 8/2017 | Patel ................... | G06F 3/067 |

OTHER PUBLICATIONS

Adrian M. Caulfield et al.; Providing Safe, User Space Access to Fast, Solid State Disks; Computer Science and Engineering Department; University of California, San Diego; ASPLOS'12, Mar. 3-7, 2012, London, England, UK; 13 pages.

Heather Gamell, Matthew Kocsis, Matthew Weber; A Survey of Phase Change Memory {PCM}; Iowa State University—CPRE581, Dec. 2010, REVB; 16 pages.

Kumud Bhandari, Dhruva R. Chakrabarti, Hans-J. Boehm; Implications of CPU Caching on Byte-addressable Non-Volatile Memory Programming; HP Laboratories HPL-2012-236; Dec. 6, 2012; Copyright 2012 Hewlett-Packard Development Company, L.P.; 7 pages.

Intel® Architecture Instruction Set Extensions Programming Reference 319433-022; Oct. 2014; Memory Instructions; 11 pages.

Jeffrey C. Mogul et al.; Operating System Support for NVM+ DRAM Hybrid Main Memory; HP Labs, Palo Alto, CA 4304 and Barcelona, Spain; Jan. 2009, 5 pages.

Mei-Ying Bian et al.; A Memory-Disk Integrated Non-volatile Memory System with its Dual Buffering Adapter; Feb. 24, 2013; Supercomputing laboratory Department of Computer Science, Yonsei University; 26 pages.

Ren-Shuo Liu et al.; NVM Duet: Unified Working Memory and Persistent Store Architecture; ASPLOS '14, Mar. 1-4, 2014, Salt Lake City, Utah, USA, ACM 978-1-4503-2305-5/14/03; Department of Computer Science and Information 7 Engineering, National Taiwan University, Taipei, Taiwan.Graduate Institute of Networking and Multimedia, National aiwan University, Taipei, Taiwan. Graduate Institute of Electronics Engineering, National Taiwan University, Taipei, Taiwan, Macronix International Co., Ltd., Hsinchu, Taiwan;15 pages.

Benjamin C. Lee et al.; Architecting Phase Change Memory as a Scalable DRAM Alternative; ISCA'09, Jun. 20-24, 2009, Austin, Texas, USA.; Copyright 2009 ACM 978-1-60558-526-0/09/06; Computer Architecture Group Microsoft Research, Redmond, WA; Computer Architecture Laboratory, Carnegie Mellon University, Pittsburgh, PA.; 12 pages.

Johan Akerman; Toward a Universal Memory; Science 308, 508 (Apr. 22, 2005);DOI: 10.1126/science.1110549; Published by AAAS; 4 pages.

* cited by examiner

Computer Accessible Storage Medium 200

Memory Error Code
202

STORING ADDRESS OF SPARE IN FAILED MEMORY LOCATION

This application is a continuation of U.S. patent application Ser. No. 16/029,829, filed Jul. 9, 2018 and now U.S. Pat. No. 10,318,377, which is a continuation of U.S. patent application Ser. No. 15/273,208, filed on Sep. 22, 2016 and now U.S. Pat. No. 10,042,701, which claims benefit of priority to U.S. Provisional Patent Application Ser. No. 62/234,287, filed on Sep. 29, 2015. The above applications are incorporated herein by reference. To the extent that any material in the incorporated application conflicts with material expressly set forth herein, the material expressly set forth herein controls.

BACKGROUND

Technical Field

Embodiments described herein are related to electronic systems including memory and memory error handling.

Description of the Related Art

Memory devices used in various electronic systems are subject to failures over time. Transient failures can be corrected using various types of error checking/correcting codes (ECC), which generally include storing additional bits that are generated over the data being stored in the memory, performing the same ECC generation operation when the data is read, and ensuring that the newly generated data and the additional bits stored with the data are equal. Permanent failures due to damage to the memory itself can be corrected with ECC to a certain extent as well, but the occurrence of permanent failures along with the possibility of transient failures in the same location increases the likelihood that uncorrectable errors will occur. Furthermore, the number of permanent failures can be larger than the number of errors that can be corrected, in which case the memory location becomes unusable.

SUMMARY

In one embodiment, a system includes a memory that includes a live section and a spares section. The live section may be mapped to the address space of the system, and may be accessed in response to memory operations. Once an entry in the live section has been detected as failed, an entry in the spares section may be allocated to replace the failed entry. During subsequent accesses to the failed entry, the allocated entry may be used instead. In an embodiment, the failed entry may be coded with an indication of the allocated entry, so that the access may be redirected to the allocated entry. In one implementation, for example, the failed entry may be coded with N copies of a pointer to the allocated entry, each copy protected by corresponding ECC. Having N copies of the pointer with ECC may increase the likelihood that any errors in the pointer may be detected and corrected.

BRIEF DESCRIPTION OF THE DRAWINGS

The following detailed description makes reference to the accompanying drawings, which are now briefly described.

FIG. 8 is a block diagram of one embodiment of a computer accessible storage medium.

Figure 1:
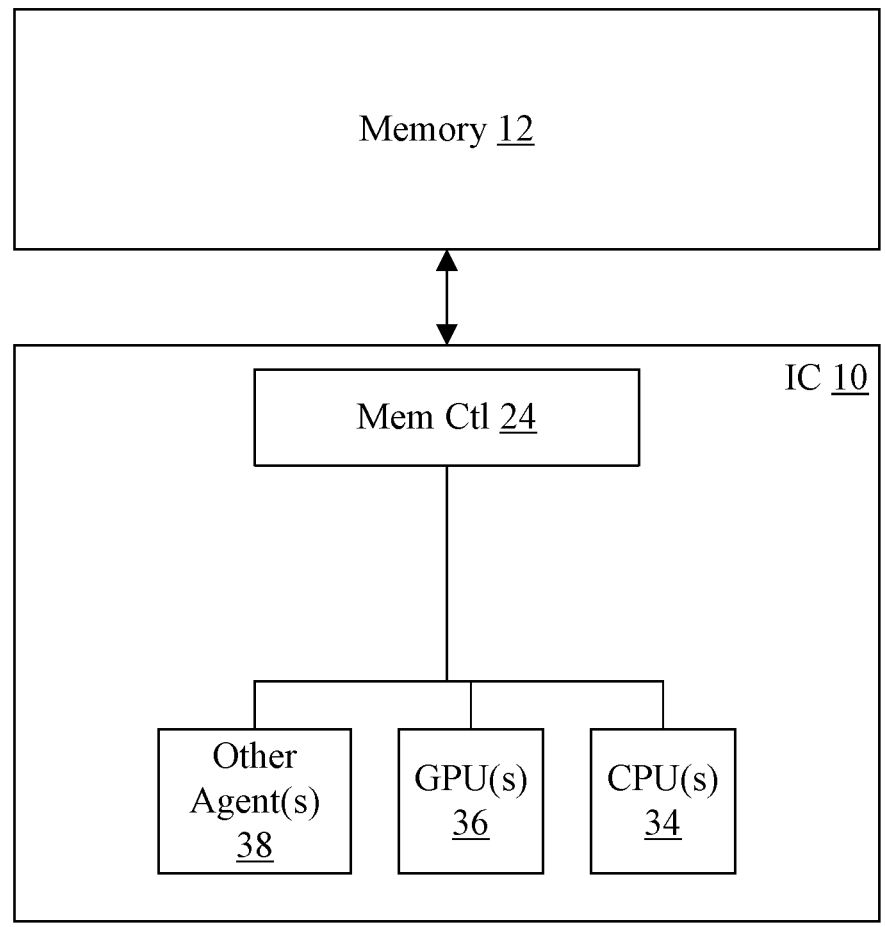
FIG. 1 is a block diagram of one embodiment of a system.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims a unit/circuit/component or other structure that is configured to perform one or more tasks is expressly intended not to invoke 35 U.S.C. § 112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

DETAILED DESCRIPTION OF EMBODIMENTS

FIG. 1 is a block diagram of one embodiment of a system. The system as shown in FIG. 1 may include an integrated circuit (IC) 10, which may in some embodiments be a system on a chip (IC). The IC 10 is coupled to a memory 12. The memory 12 may form the system memory in the system, in some embodiments. In other embodiments, the memory 12 may be cache memory, persistent storage, and/or any combination of main memory cache memory, and/or persistent storage. In the illustrated embodiment, the IC 10 includes a memory control circuit 24, one or more processors including one or more central processing units (CPUs) 34 and/or one or more graphics processing units (GPUs) 36, and one or more other agents 38. The CPUs 34, GPUs 36, agents 38, and memory control circuit 24 and crypto circuit 30 are coupled as illustrated in FIG. 1.

The memory control circuit 24 may be configured to communicate with the memory 12 on the interface defined by the memory 12, and thus may be dependent on the type of memory. Any memory may be used. For example, the memory may include one or more of static random access memory (SRAM), dynamic RAM (DRAM) such as double data rate (DDR) DRAM (e.g. DDR1, 2, 3, 4, etc.), low power versions of the DDR DRAM (e.g. LPDDR1, 2, 3, 4, etc.), or various forms of non-volatile memory. Non-volatile memory may include many types of memory that are designed to retain data when the power is removed, such as: NAND or NOR Flash memory, Resistive RAM (ReRAM), phase change memory (PCM), conductive bridge RAM (CBRAM), various forms of magnetic RAM (MRAM) (e.g. such spin transfer torque (STT) RAM. Ferroelectric RAM (FRAM or FeRAM)), Silicon Oxide Nitride Oxide Silicon (SONOS) memory, NanoRAM, etc.

The memory control circuit 24 is also configured to receive memory reads and writes from the CPUs 34, GPUs 36, and agents 38 to access the memory 12. That is, the memory reads and writes include addresses in the physical address space used to access the memory 12. The memory control circuit 24 may include various buffers/queues and circuitry to arbitrate among multiple requests to access the memory 12.

The CPUs 34 may be processors that execute the control software in the system (e.g. operating system software, device drivers, boot code, file system software, other privileged software, etc.). The CPUs 34 may also execute unprivileged code such as application programs. The GPUs 36 may execute graphics software such as rendering software, shading software, texturing software, etc. Thus, the GPUs 36 may be special purpose processors. Other types of processors may also be included (e.g. digital signal processors (DSPs), microcontrollers, etc.). The software executing on the various processors may include load/store instructions, and the processors may generate read/write memory operations to the main memory 16 responsive to the load/store instructions. The agents 38 may include various other memory operation sources. For example, various peripheral devices may read and write the main memory. Generally, the processors 34 and 36, other processors, and other agents 38 may be collectively referred to as "agents." An agent may be a source of memory operations.

In some cases, the agent may generate a virtual address, which may be translated through an address translation mechanism to a physical address. The physical address may identify a location in the memory 12, or may be translated through a second address translation data structure to a physical address in the memory 12. Other agents may generate a physical address directly, or may generate the intermediate physical address directly.

Various forms of memory 12 may be susceptible to failure over time. Generally, write endurance may refer to a number of write cycles to a given memory location that that the memory 12 is capable of withstanding before the given memory location ceases to operate correctly. Similarly, read endurance may refer to a number of read cycles to a given memory location that that the memory 12 is capable of withstanding before the given memory location ceases to operate correctly. Various types of memories have different endurance properties. Some memory may effectively have only write endurance limitations (e.g. the read endurance limitation may be effectively unlimited, although read endurance failures may still be possible). Other memory may effectively have only read endurance limitations (e.g. the write endurance limitation may be effectively unlimited, although write endurance failures may still be possible). Still other memory may have both read and write endurance limitations. Retention may refer to the ability of the memory location to return the data that was written to the memory location (if the data was successfully written). Retention may be affected by disturb events. A disturb may occur due to repeated accesses to a given memory location of one type (e.g. read or write) without an occurrence of the other type. A disturb may occur to a given memory location due to repeated accesses of one or both types to neighboring memory locations of the given memory location without an access to the given memory location. Various forms of memory may be more or less susceptible to various forms of disturb events. Some memory may be unsusceptible enough to a given disturb event to be treated as effectively immune to that event. The bit error rate of the memory may be caused both by endurance properties and by retention properties.

Various embodiments may manage endurance and retention failures in different fashions. In an embodiment, for example, a copy of data being written to the memory 12 may be retained in coherent memory (e.g. a cache in the CPUs 34 and/or GPUs 36). If the write fails, the correct data remains available in the coherent memory. An interrupt may be signaled to the CPUs 34 to allow software to handle the failure (e.g. by relocating the data to another memory location in the memory 12, such as the spares described in more detail below).

In one particular embodiment, the memory 12 may include storage for "poison bits." The memory 12 may be divided into memory blocks of a specified size (e.g. the size of a block that is encrypted as a unit, the size of a page, the size of a cache line, the size of the smallest supported memory request, the size of the largest supported memory request, etc.). For each such memory block, the memory 12 may include a poison bit. Initially, the poison bits may be zero. If an access (read or write) is performed to a memory block and the access fails (e.g. the number of bit errors that occur in the memory reaches a specified threshold based on the ability of the error correction code used in the memory to correct the bit errors), the poison bit for the block may be set and a spare location may be allocated. Based on the set state of the poison bit, subsequent reads/writes to the memory block may be performed to the spare location.

Data Retention

Figure 2:
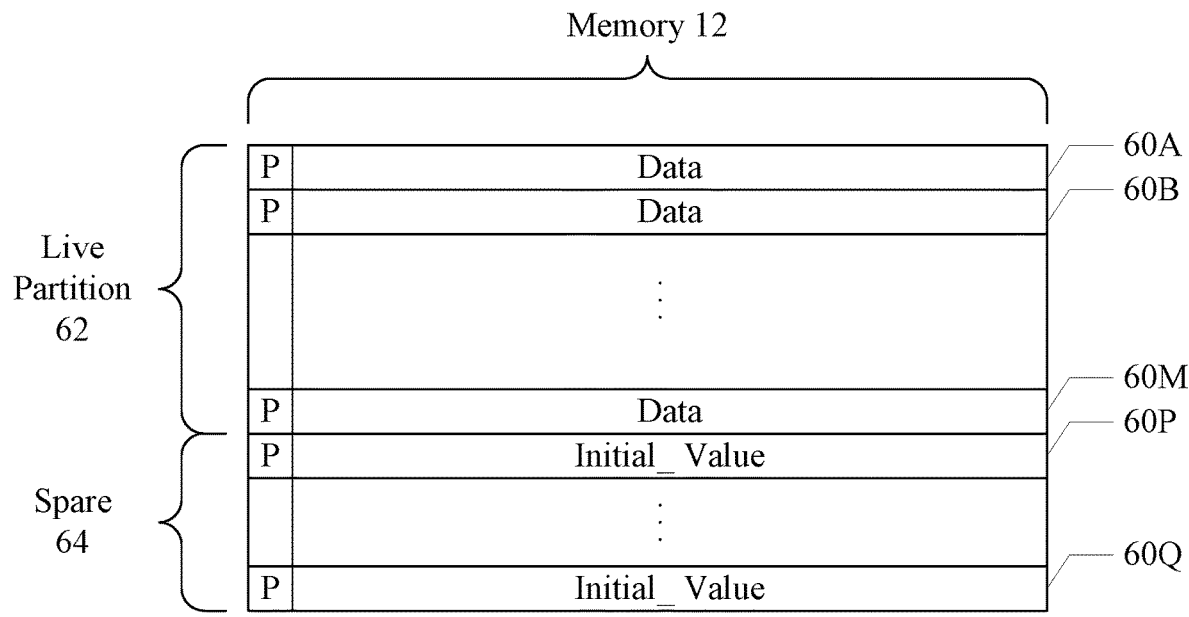
FIG. 2 is a block diagram illustrating one embodiment of poison bits and spares in an embodiment of a memory.

FIG. 2 is a block diagram illustrating one embodiment of the memory 12 divided into entries 60A-60Q. The number of entries may vary in various embodiments. Entries 60A-60M may be a live partition 62, and the remaining entries may be spares 60P-60Q. Each entry includes a memory block that may store a poison bit (P), data, and error correction code (ECC) bits. Initially, the poison bits are clear and the entries in the live partition 62 are the entries in use for the memory 12. That is, the live partition 62 may be the size of memory 12 as exposed to the IC 10. The spares 64 may be available for allocation in the event of a failure in entries within the live partition 62.

The combination of the ECC protection and the poison bits may be used in one embodiment to mitigate the effects of endurance failures and/or retention failures in the memory 12. In some embodiments, the failure mode of the memory 12 may be that a bit cannot be written after it has been written some number of times. For such a memory, each write may be verified as being successfully written. In an embodiment, successfully written may refer to a number of bit errors in the write remaining below a selected threshold. The threshold may be lower than the number of bit errors that may be corrected using the implemented ECC algorithm. In an embodiment, the selected threshold may be programmable. In other forms of memory 12, the failure mode may more likely be a read endurance failure. Again, the read endurance failure may be detected by the number of bit errors in read data exceeding a selected threshold that is lower than the number of bit errors that may be corrected using the ECC algorithm. The poison bit scheme may be used for such failures as well.

In one embodiment, the retention failure rate is low enough compared to the endurance failure rate that the retention failure rate may be effectively ignored. Accordingly, verifying a write to a memory location and/or a read from the memory location may be sufficient to ensure that the correct data is readable from the memory location at a later time. Based on this assumption, the poison bits may be managed as discussed further below.

With regard to disturb events that cause failures, a periodic but relatively infrequent write to other memory locations than a memory location that is being actively accessed may be used for mitigation. Generally, failures caused by disturb events may be overcome by writing the memory location that is being disturbed. That is, if the victim memory locations (the ones being disturbed) are written, the effects of the previous disturb events are eliminated and the victim memory location is in an undisturbed state. This is true for both neighboring disturb events as well as disturb events caused by repeatedly reading a memory location without writing it.

Accordingly, disturb events may be effectively overcome by generating a read and write of neighboring memory locations when writing a given targeted memory location. The more frequently such neighbor writes are performed, the less likely that a disturb event may result in a failure. Accordingly, the rate at which the neighbor writes are performed, as a fraction of the total number of writes, may be varied to generate the desired failure rate reductions. Similarly, read disturb events may be addressed using infrequent writes during reads. That is, some fraction of the reads may include a write to the entry being read.

Returning the discussion to managing endurance failures, the poison bit may be set to indicate if the corresponding data in the memory block has known to have previously failed. As mentioned above, the poison bit is initially clear for all blocks, and is set at most once, when the initial failure to that location is detected. Once set, it may not be subsequently reset. The poison bit may be set by the IC 10, in an embodiment (that is, the memory 12 may not attempt to set the poison bit). Additionally, if the poison bit is already set, the IC 10 does not attempt to update it again. A read or write to an entry 60A-60Q may result in a fail status from the memory 12. If setting the poison bit itself fails, the memory 12 may become unusable. In some embodiments, the probability of failing to set the poison bit may be reduced via redundancy (e.g. use two or more bits instead of one, and use the logical OR of the two as the effective poison bit). The write verification circuitry may be part of the memory 12, or may be implemented in the IC 10 (e.g. in the memory control circuit 24). While the poison bit or bits are used as an example, in general any status indicator (having one or more bits) may be used if at least one status encoding indicates that a write to the corresponding entry 60A-60Q has previously failed and at least one other status encoding indicates that the write has not previously been detected as failing.

In response to a write to an entry 60A-60M that fails and the entry has not failed previously (as indicated by the current state of the poison bit), the poison bit may be set. In one embodiment, the IC 10 may write the data and ECC to the entry, with the poison bit update equal to zero. The write verification circuitry may check the poison bit prior to performing the write and detect that the poison bit is clear. Since the stored poison bit is clear, the write may be performed to the memory. The verification may be performed by the write verification circuit reading the data from the memory 12, and a failure may be detected because the number of bits that failed to update is greater than a threshold. In response, the write verification circuitry may return a fail status for the write operation. At this point, the IC 10 may read the failing location to determine if the failure is due to the poison bit being previously set or due to the write not verifying correctly. The IC 10 may read the location and detect that the stored poison bit is clear, and thus the failure is the initial failure of the entry. In response to the first failure, the IC 10 may obtain a spare entry that is currently unallocated from the spares area 64. The IC 10 may use a strong ECC function on the address of the spare location (referred to as the "spare address"). That is the number of ECC bits compared to the number of address bits may be high. Viewed in another way, the ratio of the number of ECC bits to the number of address bits may be higher than the ratio of the number of ECC bits in the data block ECC to the number of bits in the data block. The spare address and the strong ECC bits may be replicated N times, where N is an integer greater than one and is enough to fill the Data+ECC field of the failing entry. The total number of failing bits that may be tolerated in the failing entry is at least the number of strong ECC bits*N. This number may be significantly larger than the threshold which triggers a write failure. The IC 10 may write the failing entry again, using the replicated spare address+strong ECC replicated N times, and may expressly set the poison bit. The write verification circuitry may verify that the poison bit is set correctly but may ignore the data field. If the poison bit is set, the write passes. If the poison bit remains clear, the fail status is returned for the write. Additionally, the original write data may be written to the newly allocated spare entry 60A-60Q.

A write to a previously failed entry 60A-60M (and thus the poison bit is set prior to the write) may operate somewhat differently. The write verification circuit may first read the poison bit before attempting the write, as mentioned previously, but in this case may detect that the poison bit is set. The write verification circuitry may prevent the update and return a fail status for the write. The IC 10 may read the poison bit and detect that it is set. The data field is known to include the spare address and strong ECC replicated N times, and so the IC 10 may use the data returned for the read to extract the spare location address from one of the N fields. If none of the N fields can be read without correctable failures, an unrecoverable error has occurred. If the spare address is successfully determined, the IC 10 may write the data to the spare address. The write to the spare address may operate similar to writes in the live partition 52. That is, if the write results in a fail status, the poison bit may be read and possibly a new spare location may be assigned.

Similar to the operation of the write to a previously non-failing entry, a read to an entry with the poison bit clear may be detected as failing, and may cause allocation of a spare entry. The (corrected) data from the read may be written to the spare entry and the failing entry may be written with N copies of the address of the spare entry and ECC.

A read to a poisoned location may be performed by the IC 10 reading the original location, detecting the set poison bit, extracting the spare address from the read data, and reading the spare location.

As mentioned above, the spares 64 may be a portion of memory 12 designated as spares for other locations that fail. The spare area may begin at the top end of the memory device (the highest address of the memory 12) and may grow downwards, up to a certain number of entries. The size of the spare area (the number of spares 64) may be programmable and may be provided to the hardware at boot. In one embodiment, a specific initial value may be programmed into the spares 64 ("Initial_Value" in FIG. 2). Thus, an unused spare location may be uniquely be identified by detecting the Initial_Value being stored in the entry and the poison bit being clear. In one embodiment, the Initial_Value may be selected so that an ECC check on it fails, yet the stored data can be reliably interpreted as a spare.

When the verification circuitry detects that a previously good location has failed, as described above, for the first time after a cold boot, the verification circuitry may perform a binary search on the spares 64 to find which locations have been used already and which are available, and the first available entry may be selected.

It is noted that, while the present embodiment of data retention is discussed in the context of the system of FIG. 1, generally the mechanism for managing endurance failures and/or disturb failures may apply to a memory in any sort of system. For example, the IC 10 may be replaced by discrete components in another embodiment. In another embodiment, the data retention mechanism may be applied to a unified memory system in which the memory 12 serves as both volatile and non-volatile storage in the system.

Figure 3:
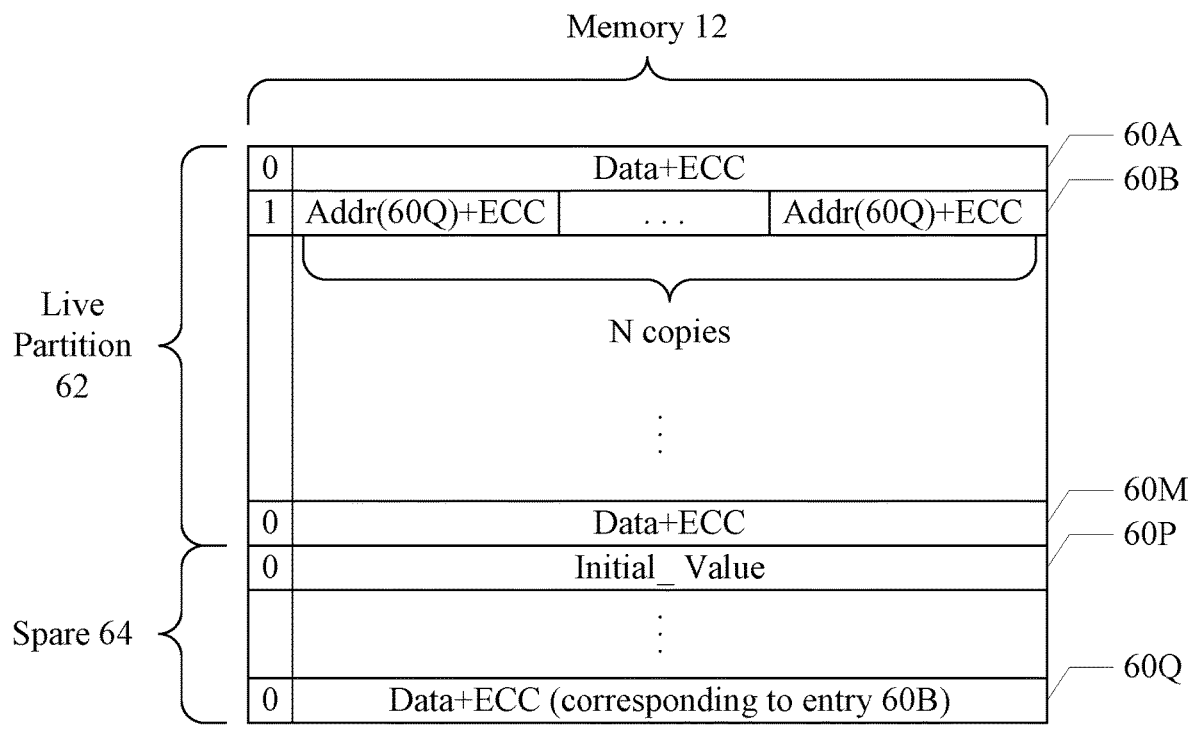
FIG. 3 is a block diagram illustrating an example of using a spare for a failed location in the memory.

FIG. 3 is an example in which the entry 60B has been detected and entry 60Q has been allocated as the spare for entry 60B. Accordingly, the P bit for entry 60B is set, and the data field has N copies of the address of entry 60Q+strong ECC. Address 60Q has the data+ECC for entry 60B.

In addition to the failure and spare allocation discussed above, embodiments are contemplated in which the memory control circuit 24 monitors the "health" of an entry it reads. For example, if the number of correctable errors in data read is near a second threshold that is lower than the threshold that indicates failure, the memory control circuit 24 may be configured to write the data back to the entry. If the errors resulted at least in part from disturb events, the number of errors may decrease.

Figure 4:
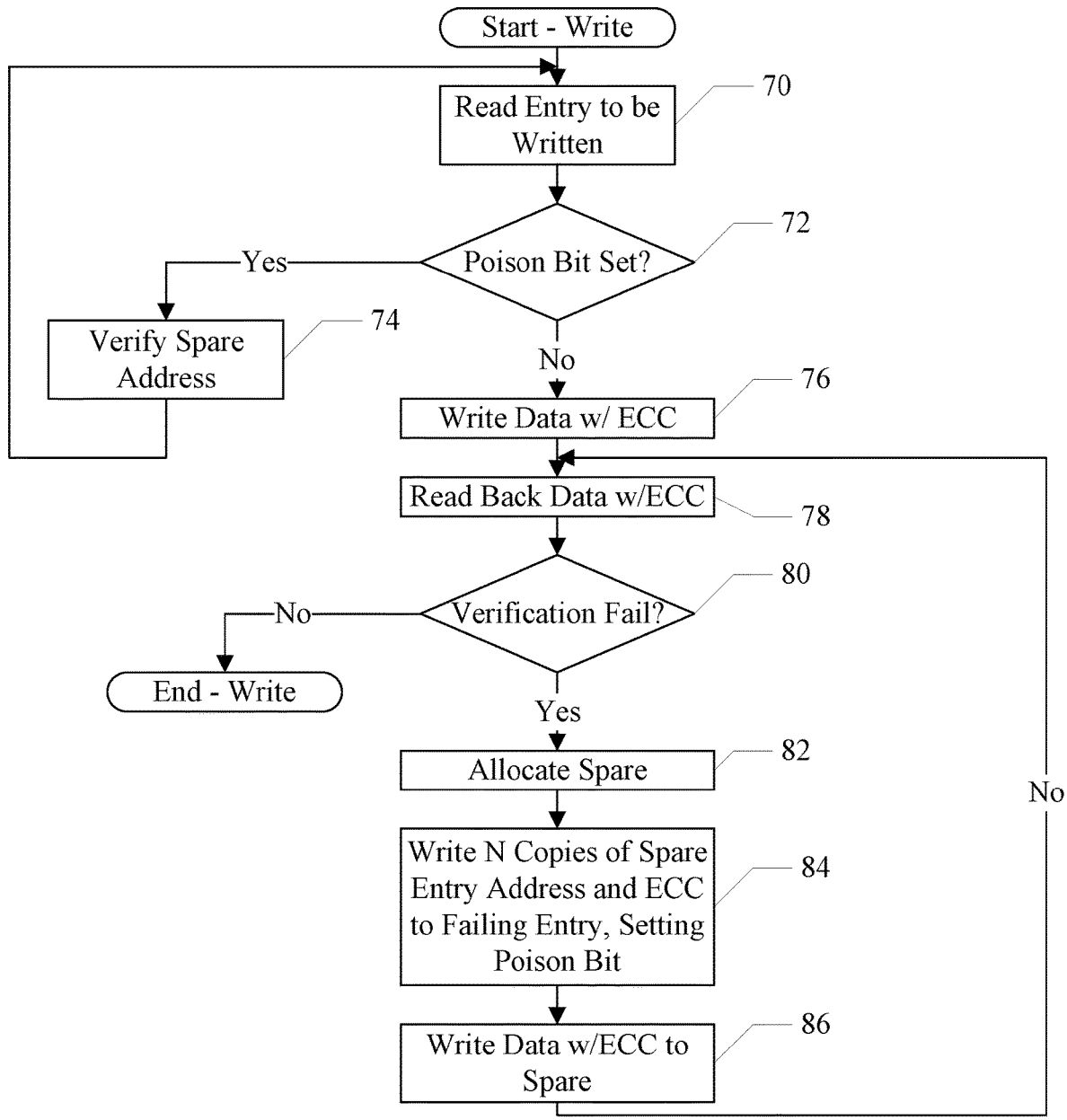
FIG. 4 is a flowchart illustrating operation of one embodiment of the system performing a memory write to the memory.

FIG. 4 is a flowchart illustrating operation of one embodiment of the system using the memory 12, to perform a memory write operation using the poison bit scheme defined above. While the blocks are shown in a particular order for ease of understanding, other orders may be used. Blocks may be performed in parallel in combinatorial logic in the system. Blocks, combinations of blocks, and/or the flowchart as a whole may be pipelined over multiple clock cycles. The system may be configured to implement the operation illustrated in FIG. 4. The operation illustrated in FIG. 4 may be implemented in the memory control circuit 24, the memory 12, a memory storing instructions executed by a processor in the system, and/or a combination thereof. For simplicity below the system will be referred to as implementing the operation.

The system may be configured to read the memory entry that is to be written, prior to attempting the update (block 70). If the poison bit from the entry is set (decision block 72, "yes" leg), the entry has previously been detected as failing and contains N copies of the spare address assigned to the entry. The system may be configured to verify the spare address (block 74). In an embodiment, it is possible that the spare address cannot be verified (e.g. each of the N copies of the spare address fails the ECC check with an uncorrectable error). In such a case, the system may become unusable. Alternatively, other action may be taken (e.g. an exception may be signaled so that the operating system may take action). The system may read the spare entry (block 70) and continue with processing. In an embodiment, the spare entry may be poisoned as well and a daisy chain of spares may link the original entry and the current entry. In other embodiments, the spare address in the original entry may be overwritten with the newly-allocated spare address when a spare entry fails, and at most one additional read may occur when the spare location is in use.

If the poison bit is not set (decision block 72, "no" leg), the system may be configured to write the data supplied with the memory write operation along with corresponding ECC data (block 76). The poison bit may not be updated in this write operation. The system may be configured to read the data back from the entry (block 78) and may verify the data (decision block 80). The verification may be performed by comparing the write data to the data read back, or using the ECC. If the verification passes (decision block 80, "no" leg), the write may be complete. The verification may pass if fewer than M bits are in error, where M may be chosen such that the ECC implemented by the system may detect and correct the errors, along with a margin to permit further errors to occur that may still be detected and corrected. M is an integer, and may be as small as zero or as large of the number of detectable, correctable errors in the ECC scheme, in various embodiments.

If the verification of the written data fails (decision block 80, "yes" leg), the system may be configured to allocate a spare entry (block 82) and may write N copies of the address of the spare entry and ECC to the failing entry (block 84). The system may be configured to write the data and ECC to the spare entry (block 86) and may begin the verification process again (block 78). In some embodiments, if the spare entry also fails, a new entry may be allocated. In other embodiments, an exception may be signaled to permit the operating system to handle the error. It is noted that, in embodiments in which the memory 12 not considered to be as susceptible to write endurance failures, the verification of the write (decision block 80) and the allocation of the spares and write of the data thereto (blocks 82, 84, and 86) may be eliminated.

Figure 5:
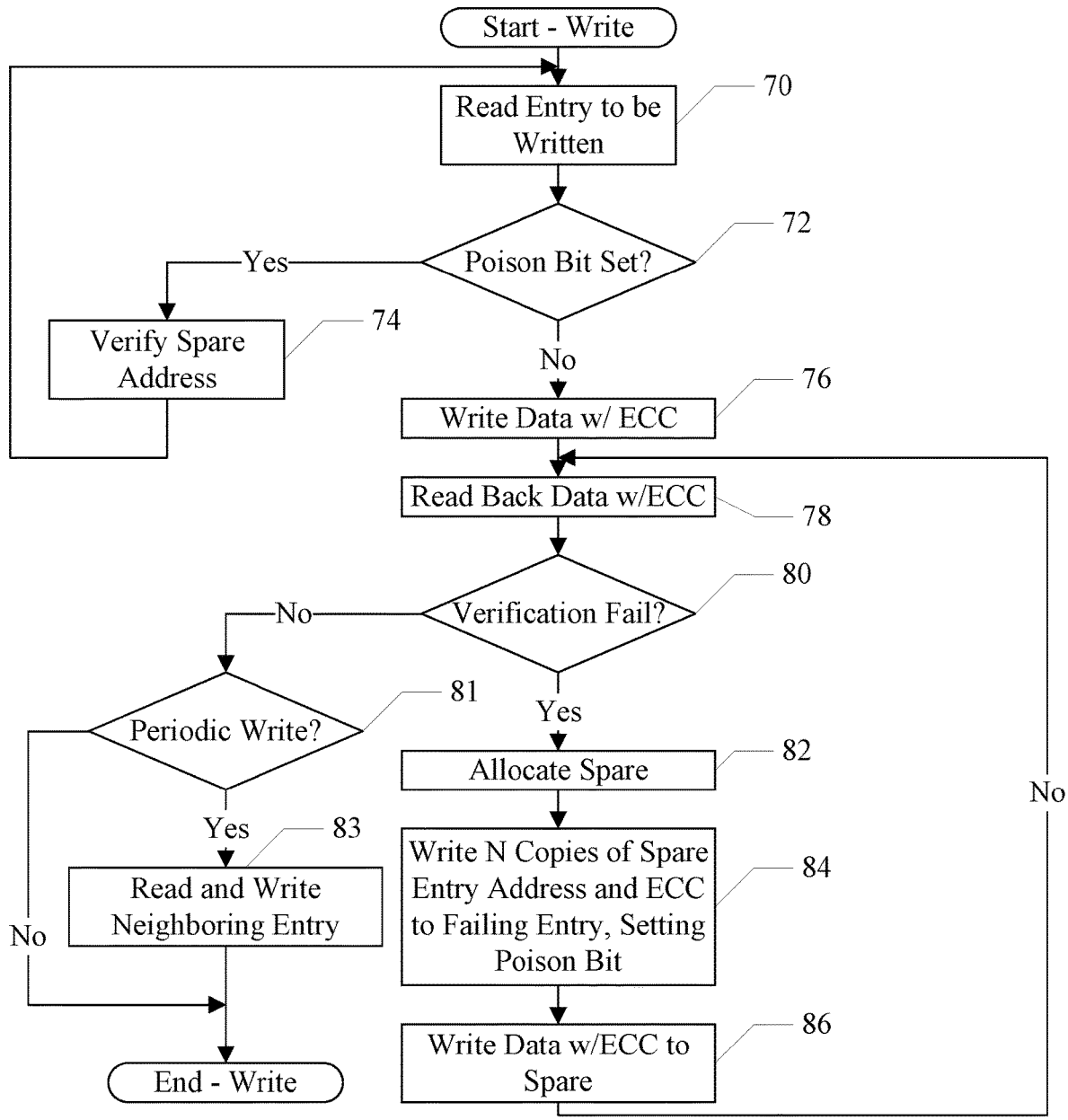
FIG. 5 is a flowchart illustrating operation of another embodiment of the system performing a memory write to the memory.

FIG. 5 is a flowchart similar to FIG. 4, but which also uses periodic writes to a neighboring entry or entries to reduce the incidence of disturb failures. While the blocks are shown in a particular order for ease of understanding, other orders may be used. Blocks may be performed in parallel in combinatorial logic in the system. Blocks, combinations of blocks, and/or the flowchart as a whole may be pipelined over multiple clock cycles. The system may be configured to implement the operation illustrated in FIG. 5. The operation illustrated in FIG. 5 may be implemented in the memory control circuit 24, the memory 12, a memory storing instructions executed by a processor in the system, and/or a combination thereof. For simplicity below the system will be referred to as implementing the operation.

The write itself may be performed as discussed above with regard to FIG. 4 (blocks 70, 72, 74, 76, 78, 80, 82, 84, and 86). Additionally, the system may determine if a periodic write of a neighboring entry is to be performed (decision block 81). For example, the system may count the number of writes performed, and may perform the periodic write once every P writes, where P is an integer and may be programmed into the system, in an embodiment. If a periodic write is to be performed (decision block 81, "yes" leg), the system may determine the address of the neighboring entry (e.g. by incrementing the address, or through a priori information regarding which entries are physically located nearby). The system may read the current data in the neighboring entry and write the data back to that entry (block 83).

While the above described embodiment may use read and write of neighboring locations to implement disturb mitigation, other embodiments may use other mechanisms. In general, a disturb mitigation operation may be performed periodically to recover data in potentially disturbed locations. The disturb mitigation operation may be at least in part dependent on the memory technology used in the memory 12. The disturb mitigation operation may include the above-described read and write of a neighboring entry. The disturb mitigation operation may include reading and writing an entry locally without passing through ECC correction. The disturb mitigation operation may include changing the biasing or timing of various read/write operations. The disturb mitigation operation may include pulsing select lines coupled to the entries. Any operation which causes disturbed data to recover to the originally-stored data may be implemented in various embodiments.

Figure 6:
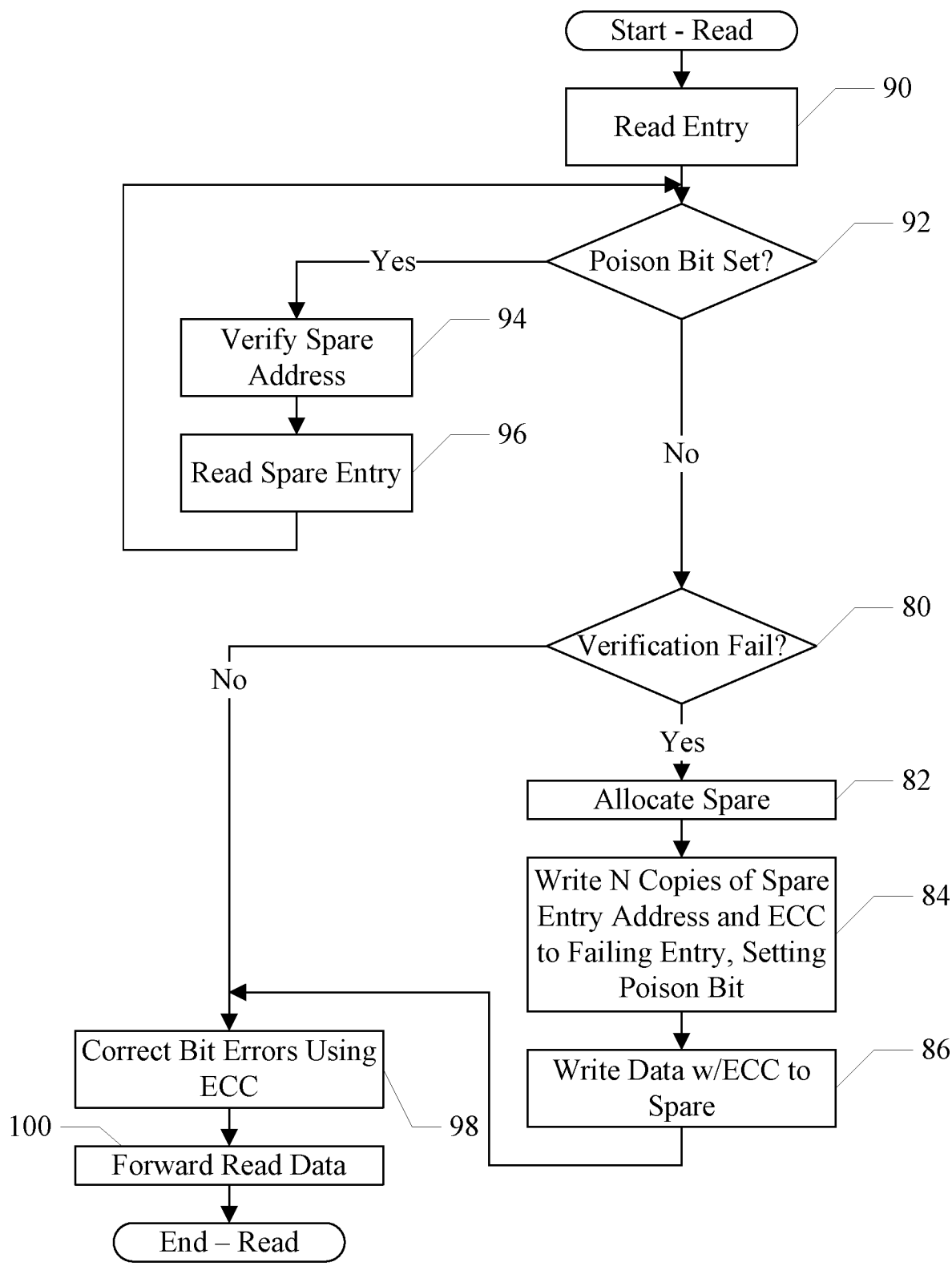
FIG. 6 is a flowchart illustrating operation of one embodiment of the system performing a memory read to the memory.

FIG. 6 is a flowchart illustrating operation of one embodiment of the system using memory 12 as a main memory, to perform a memory read operation including the poison bit scheme defined above. While the blocks are shown in a particular order for ease of understanding, other orders may be used. Blocks may be performed in parallel in combinatorial logic in the system. Blocks, combinations of blocks, and/or the flowchart as a whole may be pipelined over multiple clock cycles. The system may be configured to implement the operation illustrated in FIG. 6. The operation illustrated in FIG. 6 may be implemented in the memory control circuit 24, the memory 12, a memory storing instructions executed by a processor in the system, and/or a combination thereof. For simplicity below the system will be referred to as implementing the operation.

The system may be configured to read the addressed entry in the memory 12 (block 90). If the poison bit is set (decision block 92, "yes" leg), the system may be configured to verify the spare address (block 94) and read the data from the spare entry (block 96). The system may be configured to check the poison bit of the spare entry (decision block 92, dotted line in FIG. 6). Similar to the operation or writes discusses above, the read data may be verified and if an entry failure is detected (block 80, "yes" leg), allocating a spare entry (block 82), writing N copies of the spare address and ECC to the failing entry and setting the poison bit (block 84), and writing the read data to the spare entry (block 86) may be performed, similar to the discussion above with regard to FIG. 4. The spare entry may be similarly verified, as discussed above. The threshold of errors in the read data that may indicate failure may be the same as the threshold for the write operation, or may differ, in various embodiments. If a failure is not detected (decision block 80, "no" leg), the system may be configured to correct any detected bit errors using the ECC from the NVM 12 (block 98) and may be configured to forward the read data to the initiating agent (e.g. the CPU 34, GPU 36, or other agent 38 that initiated the read) (block 100).

Figure 7:
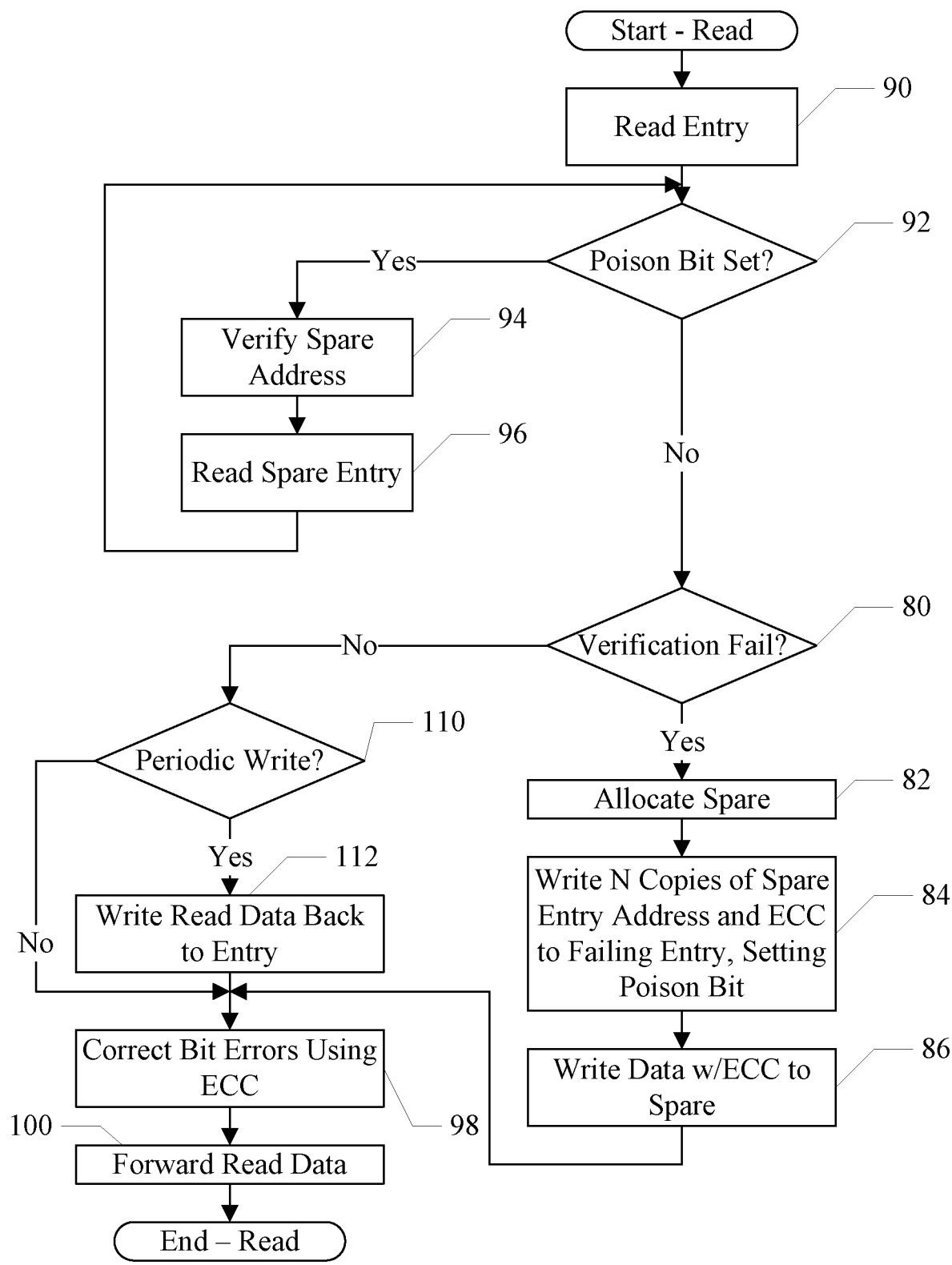
FIG. 7 is a flowchart illustrating operation of another embodiment of the system performing a memory read to the memory.

FIG. 7 is a flowchart similar to FIG. 6, but which also uses periodic writes to reduce the incidence of read disturb failures. While the blocks are shown in a particular order for ease of understanding, other orders may be used. Blocks may be performed in parallel in combinatorial logic in the system. Blocks, combinations of blocks, and/or the flowchart as a whole may be pipelined over multiple clock cycles. The system may be configured to implement the operation illustrated in FIG. 5. The operation illustrated in FIG. 5 may be implemented in the memory control circuit 24, the memory 12, a memory storing instructions executed by a processor in the system, and/or a combination thereof. For simplicity below the system will be referred to as implementing the operation.

The read itself may be performed as discussed above with regard to FIG. 6 (blocks 90, 92, 94, 96, 80, 82, 84, 86, 98 and 100). Additionally, the system may determine if a periodic write is to be perform to mitigate read disturb failures (decision block 110). For example, the system may count the number of reads performed, and may perform the periodic write once every Q reads, where Q is an integer and may be programmed into the system, in an embodiment. Q may differ from the number of writes (P) discussed above, or may be the same (and may be the same parameter programmed into the system, in some embodiments). If a periodic write is to be performed (decision block 110, "yes" leg), the system may write the read data (corrected for errors as in block 98, if applicable) back to the entry (block 112). In either case, the system may complete the read by correcting any bit errors in the read data (block 98) and forwarding the read data to the requestor (block 100).

Turning now to FIG. 8, a block diagram of one embodiment of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, the computer accessible storage medium 200 may store data in a non-transitory manner, where non-transitory in this context may refer to not transmitting the instructions/data on a signal. For example, non-transitory storage may be volatile (and may lose the stored instructions/data in response to a power down) or non-volatile. In an embodiment, the computer accessible storage medium 200 may include the memory 12.

The computer accessible storage medium 200 in FIG. 8 may store memory error code 202. The memory management code 202 may include instructions which, when executed by a CPU 34, implement the operation described for the memory error management described above (e.g. with respect to FIGS. 2-7). The memory error code 202 may implement any portion or all of the flowcharts shown in FIGS. 4-7, for example. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:

1. A system comprising:
    a memory; and
    an integrated circuit (IC) coupled to the memory, wherein the integrated circuit is configured to access the memory in response to a plurality of memory operations, and in addition to memory accesses in response to the plurality of memory operations, the integrated circuit is configured to perform a first write in conjunction with a first memory operation of the plurality of memory operations that accesses a first entry in the memory, wherein performing the first write includes selecting a second entry in the memory, reading a content of the second entry, and writing the content back to the second entry, and wherein the integrated circuit is configured to select the second entry as a neighboring entry to the first entry.

2. The system as recited in claim 1 further comprising periodically performing the first write in conjunction with selected memory operations of the plurality of memory operations.

3. The system as recited in claim 2 wherein the plurality of memory operations comprises a plurality of write memory operations, and wherein periodically performing the first write comprises performing the first write once every P write memory operations, where P is an integer.

4. The system as recited in claim 1 wherein the plurality of memory operations comprises a plurality of read memory operations, and wherein the integrated circuit is further configured to selectively write data read in response to the plurality of read memory operations back to entries in the memory from which the data was read.

5. The system as recited in claim 4 wherein the integrated circuit is configured to write the data back one every Q read operations, where Q is an integer.

6. The system as recited in claim 5 wherein the data written back to the memory is error-corrected in response to one or more errors detected when the data is read.

7. The system as recited in claim 1 wherein the first entry is addressed using a first address, and wherein a second address of the neighboring entry is determined from the first address.

8. The system as recited in claim 7 wherein the second address is determined by incrementing the first address.

9. The system as recited in claim 1 wherein the neighboring entry is physically located near the first entry in the memory.

10. An integrated circuit comprising:
    one or more agents configured to generate memory operations; and
    a memory control circuit coupled to the one or more agents and configured to access a memory in response to the memory operations, and wherein the memory operations include write memory operations, and wherein the memory control circuit is configured to selectively generate additional write memory operations corresponding to a subset of the write memory operations, wherein a first write memory operation of the additional write memory operations generated for a second write memory operation of the subset of write memory operations accesses a neighboring entry in the memory to a first entry written in response to the second write memory operation.

11. The integrated circuit as recited in claim 10 wherein the memory control circuit is configured to read data from the neighboring entry and write the data back to the neighboring entry in response to the first write memory operation.

12. The integrated circuit as recited in claim 10 wherein the write memory operations are performed over time, and wherein the subset of the write memory operations are separated from each other in the performance of the write memory operations over time.

13. The integrated circuit as recited in claim 12 wherein the subset of the write memory operations comprises one write memory operation out of every P write memory operations, where P is an integer.

14. The integrated circuit as recited in claim 10 wherein the first entry is addressed using a first address, and wherein a second address of the neighboring entry is determined from the first address.

15. The integrated circuit as recited in claim 14 wherein the second address is determined by incrementing the first address.

16. The integrated circuit as recited in claim 10 wherein the neighboring entry is physically located near the first entry in the memory.

17. An integrated circuit comprising:
one or more agents configured to generate memory operations; and
a memory control circuit coupled to the one or more agents and configured to access a memory in response to the memory operations, and wherein the memory operations include read memory operations, and wherein the memory control circuit is configured to selectively generate write memory operations corresponding to a subset of the read memory operations, wherein a first write memory operation generated for a first read memory operation of the subset of read memory operations writes data read in response to the first read memory operation back to an entry in the memory addressed by the first read memory operation.

18. The integrated circuit as recited in claim 17 wherein the read memory operations are performed over time, and wherein the subset of the read memory operations are separated from each other in the performance of the read memory operations over time.

19. The integrated circuit as recited in claim 18 wherein the subset of the write memory operations comprises one write memory operation out of every Q read memory operations, where Q is an integer.

20. The integrated circuit as recited in claim 17 further comprising error-correcting the data prior to writing the data back to the entry.

* * * * *